(12) United States Patent
Cheng et al.

(10) Patent No.: US 10,923,680 B2
(45) Date of Patent: Feb. 16, 2021

(54) MULTIFUNCTIONAL COMPOSITE PANELS AND METHODS FOR THE SAME

(71) Applicant: The Boeing Company, Chicago, IL (US)

(72) Inventors: Jiangtian Cheng, Mukilteo, WA (US); Paul S. Nordman, Everett, WA (US); Hojun Yoon, Canyon Country, CA (US); Xiaobo Zhang, Sun Valley, CA (US)

(73) Assignee: THE BOEING COMPANY, Chicago, IL (US)

( * ) Notice: Subject to any disclaimer, the term of this patent is extended or adjusted under 35 U.S.C. 154(b) by 81 days.

(21) Appl. No.: 16/157,944

(22) Filed: Oct. 11, 2018

(65) Prior Publication Data
US 2020/0119307 A1 Apr. 16, 2020

(51) Int. Cl.
| | |
|---|---|
| *H01L 51/52* | (2006.01) |
| *H01L 31/046* | (2014.01) |
| *B05D 1/00* | (2006.01) |
| *B05D 7/00* | (2006.01) |
| *H01L 31/0224* | (2006.01) |
| *H01L 31/048* | (2014.01) |
| *H01L 31/0216* | (2014.01) |

(52) U.S. Cl.
CPC ............ *H01L 51/5256* (2013.01); *B05D 1/60* (2013.01); *B05D 7/56* (2013.01); *H01L 31/0216* (2013.01); *H01L 31/022425* (2013.01); *H01L 31/046* (2014.12); *H01L 31/048* (2013.01); *H01L 51/5253* (2013.01)

(58) Field of Classification Search
CPC ... H01L 51/5256; H01L 31/048; H01L 31/18; H01L 31/206
See application file for complete search history.

(56) References Cited

U.S. PATENT DOCUMENTS

| | | | | |
|---|---|---|---|---|
| 5,885,368 A | * | 3/1999 | Lupo ...................... | C07C 17/12 136/255 |
| 6,866,901 B2 | | 3/2005 | Burrows et al. | |
| 7,198,832 B2 | | 4/2007 | Burrows et al. | |

(Continued)

FOREIGN PATENT DOCUMENTS

KR 10-20130000786 A 1/2013

OTHER PUBLICATIONS

Wang et al., "Strength and Plasticity of Nanolaminated Materials," Materials Research Letters, Sep. 1, 2016, pp. 1-19.

(Continued)

*Primary Examiner* — Edward J. Schmiedel
(74) *Attorney, Agent, or Firm* — MH2 Technology Law Group LLP (57) ABSTRACT

A method for fabricating a multifunctional composite panel is disclosed. The method can include forming a plurality of structural layers, and forming a plurality of photovoltaic layers adjacent the plurality of structural layers. Forming the plurality of structural layers can include forming alternating layers of a conductive organic material and an inorganic material. Forming the alternating layers can include forming a first layer from the conductive organic material, and forming a second layer adjacent the first layer from the inorganic material. The multifunctional composite panel can have a thickness of from about 1 mm to about 30 mm.

20 Claims, 3 Drawing Sheets

(56) References Cited

U.S. PATENT DOCUMENTS

| | | |
|---|---|---|
| 7,510,913 B2 | 3/2009 | Moro et al. |
| 7,648,925 B2 | 1/2010 | Moro et al. |
| 7,727,601 B2 | 6/2010 | Burrows et al. |
| 7,767,498 B2 | 8/2010 | Moro et al. |
| 2011/0030782 A1* | 2/2011 | Oh .................. H01L 27/301 136/258 |
| 2011/0146755 A1 | 6/2011 | Curran et al. |
| 2011/0168243 A1 | 7/2011 | Elowe et al. |
| 2011/0220191 A1* | 9/2011 | Flood .................. B82Y 10/00 136/255 |
| 2013/0022811 A1 | 1/2013 | Ahn et al. |
| 2014/0190550 A1* | 7/2014 | Loh .................. H01L 27/302 136/244 |
| 2014/0198371 A1 | 7/2014 | Conklin et al. |
| 2015/0083224 A1 | 3/2015 | Fogel et al. |

OTHER PUBLICATIONS

Meyer et al., "The Origin of Low Water Vapor Transmission Rates Through Al2O3/ZrO2 Nanolaminate Gas-Diffusion Barriers Grown by Atomic Layer Deposition," Applied Physics Letters, 96, 243308 (2010).

Cheng et al., "Thermal/Residual Stress in an Electron Beam Physical Vapor Deposited Thermal Barrier Coating System," Acta Mater., vol. 46, No. 16, 5839-5850, 1998.

Extended European Search Report dated Feb. 12, 2020 in corresponding European Application No. 19201862.0, 7 pages.

\* cited by examiner

MULTIFUNCTIONAL COMPOSITE PANELS AND METHODS FOR THE SAME

TECHNICAL FIELD

The present teachings relate to the field of composite components or panels, and more particularly, to systems and methods for fabricating multifunctional laminar composite panels.

BACKGROUND

Conventional composite components or panels can often include fibrous reinforcing materials, such as carbon fiber reinforced plastic (CFRP) and glass fiber reinforced plastic (GFRP), dispersed in resins to increase the strength of the composite panels. While the incorporation of the fibrous reinforcing materials can increase the relative strength of the composite panels, conventional methods for fabricating such composite panels often lead to inconsistencies that can compromise the mechanical strength thereof. For example, inconsistencies or the lack of reproducibility in the fabrication process can often lead to reduced mechanical strength of these composite panels. Further, these composite panels often exhibit anisotropic strength, as opposed to isotropic strength. For example, these composite panels often exhibit enhanced strength only in the direction along the length of the fibrous reinforcing materials.

In view of the foregoing, the composite panels are often fabricated from multiple sheets of the fibrous reinforcing materials, where each of the sheets are oriented in various directions to provide improved consistency and strength in various directions. Utilizing multiple sheets of the fibrous reinforcing materials, however, is often cost prohibitive and results in additional weight. In addition to the foregoing, fibrous reinforcing materials (e.g., CFRP, GFRP, etc.) often exhibit relatively low electric conductivity; and thus, can often require post-treatment or processing of the composite panels to provide electromagnetic effect (EME) protection. The post-treatment or processing of the composite panels extends manufacturing times and is cost-prohibitive.

What is needed, then, are improved composite panels and methods for fabricating the same.

SUMMARY

The following presents a simplified summary in order to provide a basic understanding of some aspects of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

Examples of the disclosure provide a method for fabricating a multifunctional composite panel. The method includes forming a plurality of structural layers, and forming a plurality of photovoltaic layers adjacent the plurality of structural layers. Forming the plurality of structural layers includes forming alternating layers of a conductive organic material and an inorganic material. Forming the alternating layers can include forming a first layer from the conductive organic material, and forming a second layer adjacent the first layer from the inorganic material. The multifunctional composite panel can have a thickness of from about 1 mm to about 30 mm. In at least one example, the plurality of structural layers or the plurality of photovoltaic layers are formed from a layer deposition process. The inorganic material of the second layer can include one or more of aluminum oxide ($Al_2O_3$), graphene, silicon oxide, indium tin oxide (ITO), aluminum doped zinc oxide (AZO), or any combination thereof. In at least one example, the inorganic material of the second layer can include silicon oxide, and the silicon oxide can be treated with magnesia. In at least one example, the conductive organic material of the first layer can include one or more conductive polymers. The one or more conductive polymers can include one or more thermoplastics selected from polyimide, polyethylene terephthalate (PET), poly(methylmethacrylate) (PMMA), and combinations thereof. The method can include forming a first layer of the plurality of structural layers on a mandrel. In at least one example, the method can include separating the mandrel from the first layer of the plurality of structural layers. In another example, the mandrel can form at least a portion of the multifunctional composite panel. In one example, the method cam further include forming a surface protection layer adjacent the photovoltaic layers, where the surface protection layers can include aluminum oxide, graphene, or any combination thereof. Forming the plurality of photovoltaic layers adjacent the plurality of structural layers can include forming a third layer adjacent the second layer, where the third layer includes aluminum oxide, graphene, or any combination thereof, forming a fourth layer adjacent the third layer, where the fourth layer includes a conductive material; and forming a fifth layer adjacent the fourth layer, where the fifth layer includes one or more conductive polymers. Forming the plurality of photovoltaic layers adjacent the plurality of structural layers can further include forming a sixth layer adjacent the fifth layer, where the sixth layer includes graphene, indium tin oxide, or any combination thereof. The conductive material of the fourth layer can include graphene, indium tin oxide, or any combination thereof. The conductive polymers of the fifth layer can include one or more of poly(3,4-ethylenedioxythiophene) (PEDOT), polystyrene sulfonate (PSS), PEDOT:PSS, polypyrroles (PPy), polyaniline (PANT), polyacetylene, polythiophene (PT), polyacetylene (PAC), poly p-phenylene vinylene (PPV), or any combination thereof.

Examples of the disclosure can provide a system for fabricating the multifunctional composite panel of claim 1. The system can include a base configured to support the multifunctional composite panel, and a plurality of application heads disposed proximal the base and configured to form the plurality of structural layers and the plurality of photovoltaic layers to form the multifunctional composite panel. The base and at least one of the plurality of application heads can be configured to move relative to one another during formation of the plurality of structural layers and the plurality of photovoltaic layers.

Examples of the disclosure provide a multifunctional composite panel. The multifunctional composite panel can have a thickness of from about 1 mm to about 30 mm, and can include a plurality of structural layers and a plurality of photovoltaic layers disposed adjacent the plurality of structural layers. The plurality of structural layers can include alternating layers of an organic material and an inorganic material, and the plurality of photovoltaic layers can be configured to convert light energy into electrical power. The inorganic material of the alternating layers can include one or more of aluminum oxide ($Al_2O_3$), graphene, silicon oxide, or any combination thereof. The organic material of the alternating layers can include one or more thermoplastics. The thermoplastics can include one or more of polyimide, polyethylene terephthalate (PET), poly(methylmethacrylate) (PMMA), or combinations thereof. The multifunctional composite panel can include one or more of the following: a transparency of from about 30% to about 95%, as measured by the transmissivity of light, an in-plane specific stiffness of greater than or equal to 15.0E6 $m^2/s^2$, a thermal expansion coefficient in one or more directions of greater than or equal to about 0° $K^{-1}$, and less than or equal to about 50 E-6° $K^{-1}$, an in-plane specific strength ($\sigma x/\rho$) of greater than or equal to about 150 kN·m/Kg, and/or a density of from about 1.5 $g/cm^3$ to about 2.20 $g/cm^3$. The multifunctional composite panel can be free or substantially free of structural fibers.

The features, functions, and advantages that have been discussed can be achieved independently in various implementations or can be combined in yet other implementations further details of which can be seen with reference to the following description and drawings.

BRIEF DESCRIPTION OF THE DRAWINGS

The accompanying drawings, which are incorporated in and constitute a part of this specification, illustrate the present teachings and together with the description, serve to explain the principles of the disclosure. In the figures.

It should be noted that some details of the Figures have been simplified and are drawn to facilitate understanding of the present teachings rather than to maintain strict structural accuracy, detail, and scale.

DETAILED DESCRIPTION

The following description of various typical aspect(s) is merely exemplary in nature and is in no way intended to limit the disclosure, its application, or uses.

As used throughout this disclosure, ranges are used as shorthand for describing each and every value that is within the range. It should be appreciated and understood that the description in a range format is merely for convenience and brevity, and should not be construed as an inflexible limitation on the scope of any examples or implementations disclosed herein. Accordingly, the disclosed range should be construed to have specifically disclosed all the possible subranges as well as individual numerical values within that range. As such, any value within the range can be selected as the terminus of the range. For example, description of a range such as from 1 to 5 should be considered to have specifically disclosed subranges such as from 1.5 to 3, from 1 to 4.5, from 2 to 5, from 3.1 to 5, etc., as well as individual numbers within that range, for example, 1, 2, 3, 3.2, 4, 5, etc. This applies regardless of the breadth of the range.

Unless otherwise specified, all percentages and amounts expressed herein and elsewhere in the specification should be understood to refer to percentages by weight. The amounts given are based on the active weight of the material.

Additionally, all numerical values are "about" or "approximately" the indicated value, and take into account experimental error and variations that would be expected by a person having ordinary skill in the art. It should be appreciated that all numerical values and ranges disclosed herein are approximate values and ranges, whether "about" is used in conjunction therewith. It should also be appreciated that the term "about," as used herein, in conjunction with a numeral refers to a value that can be ±0.01% (inclusive), ±0.1% (inclusive), ±0.5% (inclusive), ±1% (inclusive) of that numeral, ±2% (inclusive) of that numeral, ±3% (inclusive) of that numeral, ±5% (inclusive) of that numeral, ±10% (inclusive) of that numeral, or ±15% (inclusive) of that numeral. It should further be appreciated that when a numerical range is disclosed herein, any numerical value falling within the range is also specifically disclosed.

As used herein, "free" or "substantially free" of a material can refer to a composition, component, or phase where the material is present in an amount of less than 10.0 weight %, less than 5.0 weight %, less than 3.0 weight %, less than 1.0 weight %, less than 0.1 weight %, less than 0.05 weight %, less than 0.01 weight %, less than 0.005 weight %, or less than 0.0001 weight % based on a total weight of the composition, component, or phase.

All references cited herein are hereby incorporated by reference in their entireties. In the event of a conflict in a definition in the present disclosure and that of a cited reference, the present disclosure controls.

Reference will now be made in detail to examples of the present teachings, which are illustrated, in the accompanying drawings. Wherever possible, the same reference numbers will be used throughout the drawings to refer to the same or like parts.

Exemplary composite components or panels and methods for the same are disclosed herein. The composite panels disclosed herein have improved isotropic stiffness and strength, improved strength and stiffness under tension and/or compression in all directions, reduced delamination, reduced inconsistencies, and/or improved interface bonding, as compared to conventional composite panels (e.g., fiber based composite panels). The improved isotropic stiffness and strength can be provided by the strength of inorganic materials utilized to form the structural parts. For example, the improved isotropic stiffness and strength can be provided by the strength of the silicates utilized to form the structural parts. The improved isotropic strength and stiffness can also be provided by the absence or substantial absence of contaminants, such as water, in the inorganic materials (e.g., silicates), which can contaminate and reduce the strength of the inorganic materials. The ability to exclude water in the inorganic materials can be provided by the methods disclosed herein. The methods disclosed herein to fabricate the composite panels can produce composite panels having improved isotropic stiffness and strength, improved strength and stiffness under tension and/or compression in all directions, reduced delamination, reduced inconsistencies, and/or improved interface bonding, as compared to conventional composite panels (e.g., fiber-based composite panels). For example, the methods for fabricating the composite panel can include fabricating the structural part in a vacuum to thereby reduce or eliminate processing inconsistencies and/or exclude contaminants, such as water, which can contaminate and reduce the strength of the materials used to fabricate the composite panel. The methods disclosed herein can also eliminate larger micron-sized inconsistencies and stronger bonding interfaces between layers of the composite panels through layer-by-layer deposition and/or through vacuum deposition, which can eliminate contaminants from the deposition process.

Figure 1:
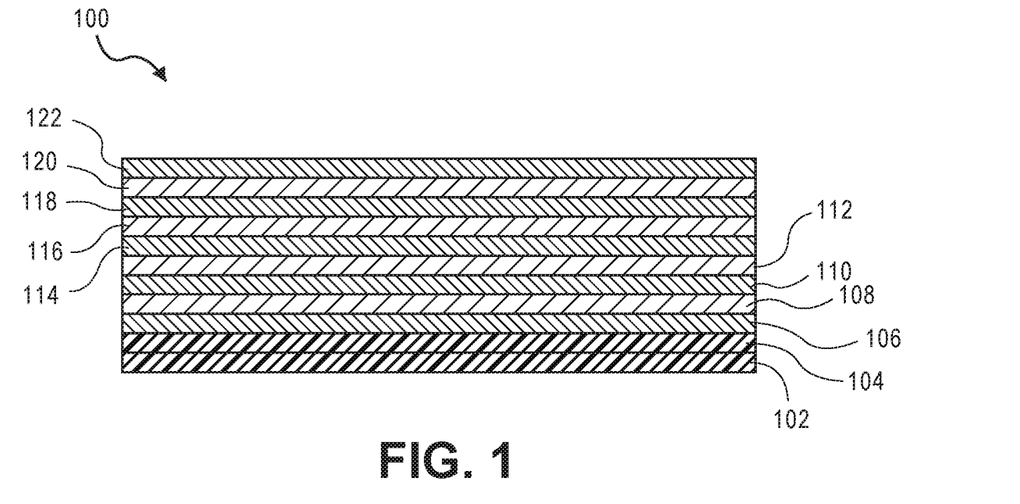
FIG. 1 illustrates a side, cross-sectional view of an exemplary composite panel, according to one or more implementations disclosed.

FIG. 1 illustrates a side, cross-sectional view of an exemplary composite component or panel 100, according to one or more implementations disclosed. As further described herein, the composite panel 100 can be a multifunctional composite panel and/or a structural composite panel. For example, the composite panel 100 can be capable of or configured to utilize solar energy (e.g., solar panel) and can further be capable of or configured to provide structural support. As illustrated in FIG. 1, the composite panel 100 includes a plurality of layers (eleven are indicated 102, 104, 106, 108, 110, 112, 114, 116, 118, 120, 122). It should be appreciated that the number of layers illustrated is only exemplary and the number of distinct layers can be from about 200 to about 75,000 layers or more. For example, the number of layers 102, 104, 106, 108, 110, 112, 114, 116, 118, 120, 122 utilized to form the composite panel 100 can be from about 200, about 400, about 1,000, about 10,000, about 20,000, or about 30,000 to about to about 40,000, about 50,000, about 60,000, about 75,000, or more.

In at least one implementation, as further described herein, the composite panel 100 can be fabricated as a single or monolithic piece including the plurality of layers 102, 104, 106, 108, 110, 112, 114, 116, 118, 120, 122, where one or more of the layers 102, 104, 106, 108, 110, 112, 114, 116, 118, 120, 122 can be or form at least a portion of a substrate. Fabricating the composite panel 100 as a monolithic piece can provide improved isotropic strength and stiffness. In another implementation, as discussed below, the composite panel 100 can be fabricated on a mandrel, thereby forming the composite panel 100 including the mandrel and the plurality of layers 102, 104, 106, 108, 110, 112, 114, 116, 118, 120, 122. It should be appreciated that the mandrel can be integral to the composite panel 100 or removable from the composite panel 100.

The composite panel 100 can have a thickness of from about 1 mm to about 30 mm or greater. For example, the thickness of the composite panel 100 can be from about 1 mm, about 2 mm, about 4 mm, about 6 mm, about 8 mm, about 10 mm, about 12 mm, or about 14 mm to about 16 mm, about 18 mm, about 20 mm, about 22 mm, about 24 mm, about 26 mm, about 28 mm, about 30 mm, or greater. In another example, the thickness of the composite panel 100 can be greater than or equal to about 2 mm, greater than or equal to about 5 mm, greater than or equal to about 10 mm, greater than or equal to about 15 mm, greater than or equal to about 20 mm, greater than or equal to about 25 mm, greater than or equal to about 30 mm, greater than or equal to about 40 mm, greater than or equal to about 50 mm, or greater than or equal to about 100 mm.

The thickness of each of the layers 102, 104, 106, 108, 110, 112, 114, 116, 118, 120, 122 of the composite panel 100 is not particularly limited. In at least one implementation, the thickness of each of the layers 102, 104, 106, 108, 110, 112, 114, 116, 118, 120, 122 can be at least partially determined by one or more desired properties of the composite panel 100 and/or the layers 102, 104, 106, 108, 110, 112, 114, 116, 118, 120, 122 thereof. As such, each of the layers 102, 104, 106, 108, 110, 112, 114, 116, 118, 120, 122 of the composite panel 100 can have a thickness that varies widely. Any one or more of the layers 102, 104, 106, 108, 110, 112, 114, 116, 118, 120, 122 can have a thickness the same or different than any one or more of the remaining layers 102, 104, 106, 108, 110, 112, 114, 116, 118, 120, 122. In at least one implementation, each of the layers 102, 104, 106, 108, 110, 112, 114, 116, 118, 120, 122, separately and independently, can have a thickness of from about 1 nm (0.001 µm) to about 40 µm or greater. For example, each one of the layers 102, 104, 106, 108, 110, 112, 114, 116, 118, 120, 122, separately and independently, can have a thickness of from about 0.001 µm, about 0.01 µm, about 0.05 µm, about 0.1 µm, about 0.5 µm, about 1 µm, about 2 µm, about 4 µm, about 6 µm, about 8 µm, about 10 µm, about 12 µm, about 14 µm, about 16 µm, about 18 µm, or about 20 µm to about 22 µm, 24 µm, 26 µm, 28 µm, 30 µm, 32 µm, 34 µm, 36 µm, 38 µm, 40 µm, or greater.

The composite panel 100 can have an overall density that varies widely from about 1.5 g/cm$^3$ to about 2.20 g/cm$^3$. For example, the density of the composite panel 100 can be from about 1.5 g/cm$^3$, about 1.6 g/cm$^3$, about 1.7 g/cm$^3$, or about 1.8 g/cm$^3$ to about 1.9 g/cm$^3$, about 2.0 g/cm$^3$, about 2.1 g/cm$^3$, or about 2.2 g/cm$^3$.

The composite panel 100 can have an overall transparency, as measured by the transmissivity of light, of from about 30% to about 95% or greater. For example, the composite panel 100 can have an overall transparency of from about 30%, about 40%, about 50%, about 60%, or about 70% to about 75%, about 80%, about 85%, about 90%, about 95%, or greater. The transparency of the composite panel 100 allows visibility of impact damage, thereby eliminating barely visible impact damage (BVID), which is a limitation in conventional composite panels fabricated from carbon fiber reinforced plastic (CFRP) and glass fiber reinforced plastic (GFRP). The overall transparency of the composite panel 100 can allow sufficient sunlight exposure to the photovoltaic layers 112, 114, 116, 118 disclosed herein. The overall transparency of the composite panel 100 can also provide visibility to impact damage and lightning strikes.

The composite panel 100 can have a thermal expansion coefficient in one or more directions of greater than or equal to about 0° K$^{-1}$, and less than or equal to about 50 E-6° K$^{-1}$, less than or equal to about 45 E-6° K$^{-1}$, less than or equal to about 40 E-6° K$^{-1}$, less than or equal to about 35 E-6° K$^{-1}$, less than or equal to about 30 E-6° K$^{-1}$, less than or equal to about 25 E-6° K$^{-1}$, less than or equal to about 20 E-6° K$^{-1}$, or less than or equal to about 15 E-6° K$^{-1}$. The thermal expansion coefficient of the composite panel 100 can reduce or prevent thermal distortion and/or provide additional thermal load to the composite panel 100.

The composite panel 100 can have an in-plane specific stiffness of greater than or equal to about 15.0E6 m$^2$/s$^2$, greater than or equal to about 25.0E6 m$^2$/s$^2$ 170, greater than or equal to about 35.0E6 m$^2$/s$^2$, greater than or equal to about 45.0E6 m$^2$/s$^2$, greater than or equal to about 55.0E6 m$^2$/s$^2$, greater than or equal to about 65.0E6 m$^2$/s$^2$, greater than or equal to about 75.0E6 m$^2$/s$^2$, greater than or equal to about 85.0E6 m$^2$/s$^2$, greater than or equal to about 95.0E6 m$^2$/s$^2$, greater than or equal to about 105.0E6 m$^2$/s$^2$, greater than or equal to about 115.0E6 m$^2$/s$^2$, greater than or equal to about 125.0E6 m$^2$/s$^2$, or greater than or equal to about 135.0E6 m$^2$/s$^2$. greater than or equal to about 145.0E6 m$^2$/s$^2$ or greater than or equal to about 155.0E6 m$^2$/s$^2$. The in-plane specific stiffness can allow the composite panel 100 to efficiently carry loads without excessive deformation and/or stability issues.

The composite panel 100 can have an in-plane specific strength ($\sigma x/\rho$) of greater than or equal to about 150 kN·m/

Kg, greater than or equal to about 275 kN·m/Kg, greater than or equal to about 400 kN·m/Kg, greater than or equal to about 525 kN·m/Kg, greater than or equal to about 650 kN·m/Kg, greater than or equal to about 775 kN·m/Kg, greater than or equal to about 900 kN·m/Kg, greater than or equal to about 1025 kN·m/Kg, greater than or equal to about 1150 kN·m/Kg, greater than or equal to about 1275 kN·m/Kg, greater than or equal to about 1400 kN·m/Kg, greater than or equal to about 1525 kN·m/Kg, greater than or equal to about 1650 kN·m/Kg, greater than or equal to about 1775 kN·m/Kg, greater than or equal to about 1900 kN·m/Kg, greater than or equal to about 2025 kN·m/Kg, greater than or equal to about 2150 kN·m/Kg, or greater than or equal to about 2300 kN·m/Kg. The in-plane specific strength can prevent the composite panel 100 from failing under applied structural loads.

The composite panel 100 can be free or substantially free of fibers. For example, the composite panel 100 can be free or substantially free of structural fibers, such as those utilized to fabricate conventional composite panels, such as carbon fiber reinforced plastic (CFRP) and glass fiber reinforced plastic (GFRP). As used herein, "free" or "substantially free" of a material can refer to a composition, component, or phase where the material is present in an amount of less than 10.0 weight %, less than 5.0 weight %, less than 3.0 weight %, less than 1.0 weight %, less than 0.1 weight %, less than 0.05 weight %, less than 0.01 weight %, less than 0.0005 weight %, less than 0.0001 weight %, or less than 0.00001 based on a total weight of the composition, component, or phase. By providing the composite panel 100 that is free or substantially free of fibers, unidirectional stiffness and strength is prevented.

Each of the one or more layers 102, 104, 106, 108, 110, 112, 114, 116, 118, 120, 122 of the composite panel 100 can be fabricated from one or more materials. For example, each of layers 102, 104, 106, 108, 110, 112, 114, 116, 118, 120, 122 of the composite panel 100 can be fabricated from a single material or a plurality of materials. For example, at least one layer of the plurality of layers 102, 104, 106, 108, 110, 112, 114, 116, 118, 120, 122 can be fabricated from a single material. In another example, at least a portion of one layer of the plurality of layers 102, 104, 106, 108, 110, 112, 114, 116, 118, 120, 122 can be fabricated from a first material and another portion of the one layer can be fabricated from a second material. In at least one implementation, adjacent layers of the one or more 102, 104, 106, 108, 110, 112, 114, 116, 118, 120, 122 can be fabricated from the same material. In another implementation, adjacent layers of the one or more layers 102, 104, 106, 108, 110, 112, 114, 116, 118, 120, 122 can be fabricated from different materials. In an exemplary implementation, at least a portion of the composite panel 100 includes alternating layers of at least two materials. For example, at least a portion of the composite panel 100 can include a first layer fabricated from a first material, a second layer fabricated from a second material, a third layer fabricated from the first material, and a fourth layer fabricated from the second material.

The one or more materials utilized to form the one or more layers 102, 104, 106, 108, 110, 112, 114, 116, 118, 120, 122 of the composite panel 100 can vary widely. For example, each of the materials utilized to form the one or more layers 102, 104, 106, 108, 110, 112, 114, 116, 118, 120, 122 can be or include, but are not limited to, one or more inorganic materials, one or more organic materials, one or more ceramics, one or more alloys, one or more metals, one or more superalloys, one or more non-metals, one or more metalloids, one or more binders, one or more additives, or the like, or any combination, compounds, or composites thereof. Additional materials utilized to form the one or more layers 102, 104, 106, 108, 110, 112, 114, 116, 118, 120, 122 can be or include, but are not limited to, one or more conductive materials, one or more carbon nanomaterials, one or more conducting oxides, such as transparent conducting oxides, one or more conductive polymers, or the like, or any combination, compounds, or composites thereof. Ceramics can provide high temperature strength and stiffness as well as a thermal barrier and burn through protection for the structural part 100.

The inorganic materials or compounds can be or include, but are not limited to, one or more silicates (e.g., silicate glass), one or more inorganic materials formed from suitable alkoxides, one or more oxides, such as aluminum oxide, silicon oxide, hafnium oxide, zirconium oxide, lanthanum oxide, tungsten oxide, or the like, or any composite, compound, or combination thereof.

The inorganic materials can also be or include, but are not limited to, the conductive or conducting oxides. Illustrative conductive or conducting oxides (e.g., transparent conducting oxides) of the one or more layers 102, 104, 106, 108, 110, 112, 114, 116, 118, 120, 122 of the composite panel 100 can be or include, but are not limited to, indium tin oxide (ITO), doped ITO (e.g., Sn-doped ITO), fluorine-doped tin oxide, tin oxide, indium oxide, aluminum doped zinc oxide (AZO), zinc oxide, or the like, or combinations, or composites thereof.

The organic materials or compounds can be or include, but are not limited to, one or more polymers. Utilizing the organic materials can provide bonding strength between adjacent layers and/or at least partially reduce brittleness of the composite panel 100. Additionally, utilizing the organic materials can provide moisture and/or impact protection to the composite panel 100. Utilizing polymers as the organic material can reduce cost, facilitate processing, and/or maintain weight efficiency. Illustrative polymers can be or include, but are not limited to, thermoplastics, polyolefin-based polymers, acryl-based polymers, polyurethane-based polymers, ether-based polymers, polyester-based polymers, polyamide-based polymers, formaldehyde-based polymers, silicon-based polymers, or any combination thereof. For example, the polymers can include, but are not limited to, poly(ether ether ketone) (PEEK), polyvinylphenol, TORLON®, polyamide-imides, polyethylene (PE), polyvinyl fluoride (PVF), polyvinyl chloride (PVC), polyvinylidene fluoride (PVDF), polyethylene terephthalate (PET), polyvinylidene chloride (PVDC), polychlorotrifluoroethylene (PCTFE), polytetrafluoroethylene (PTFE), polyether sulfone (PES), polyethylene naphthalate (PEN), polypropylene (PP), poly(1-butene), poly(4-methylpentene), polystyrene, polyvinyl pyridine, polybutadiene, polyisoprene, polychloroprene, styrene-acrylonitrile copolymer, acrylonitrile-butadiene-styrene terpolymer, ethylene-methacrylic acid copolymer, styrene-butadiene rubber, tetrafluoroethylene copolymer, polyacrylate, poly(methylmethacrylate) (PMMA), polylactic acid, nylon, acrylonitrile butadiene styrene, polybenzimidazole, polycarbonate, polyoxymethylene, polyetherimide, polyphenyl oxide (PPO), polymethacrylate, polyacrylamide, polyvinyl acetate, polyvinyl alcohol, polyvinyl butyral, polyvinyl ether, polyvinylpyrrolidone, polyvinylcarbazole, polyurethane, polyacetal, polyethylene glycol, polypropylene glycol, epoxy resins, polyphenylene oxide, polyethylene terephthalate, polybutylene terephthalate, polydihydroxymethylcyclohexyl terephthalate, cellulose esters, polycarbonate, polyamide, polyimide, any copolymers thereof, or any combination thereof. Additionally illustrative polymers can also include, but are not limited to, polymers created from styrene polymer precursors, methyl styrene polymer precursors, (meth)acrylate polymer precursors, both fluorinated and non-fluorinated forms of these precursors, and combinations of two or more of these precursors. It can be appreciated that the polymers can include any combination of at least two or more of the foregoing.

In at least one implementation, the one or more polymers can be or include an elastomer, synthetic rubber, or any combination thereof. Illustrative elastomeric materials and synthetic rubbers can include, but are not limited to, VITON®, nitrile, polybutadiene, acrylonitrile, polyisoprene, neoprene, butyl rubber, chloroprene, polysiloxane, styrene-butadiene rubber, hydrin rubber, silicone rubber, ethylene-propylene-diene terpolymers, any copolymers thereof, or any combination thereof.

In at least one implementation, the one or more polymers can be or include, but are not limited to, one or more conducting or conductive polymers. The conductive polymers of the one or more layers 102, 104, 106, 108, 110, 112, 114, 116, 118, 120, 122 of the composite panel 100 can be or include, but are not limited to, poly(3,4-ethylenedioxythiophene) (PEDOT), polystyrene sulfonate (PSS), PEDOT: PSS, polypyrroles (PPy), polyaniline (PANT), polyacetylene, polythiophene (PT), polyacetylene (PAC), poly p-phenylene vinylene (PPV), or the like, or combinations or composites thereof.

The metals of the one or more layers 102, 104, 106, 108, 110, 112, 114, 116, 118, 120, 122 of the composite panel 100 can be or include, but are not limited to, one or more alkali metals, one or more alkaline earth metals, one or more transition metals, one or more post-transition metals, or any mixtures, alloys, or compounds thereof. Illustrative transition metals can include, but are not limited to, chromium, iron, cobalt, molybdenum, tungsten, tantalum, titanium, zirconium, niobium, rhenium, yttrium, vanadium, hafnium, or any mixtures, alloys, or compounds thereof. Illustrative metals can also be or include, but are not limited to, aluminum, iron, titanium, or the like, or any combination thereof. The metals can also be or include metal alloys and superalloys, such as stainless steel, carbon steel, a nickel-based superalloy, a cobalt-based superalloy, or the like, or any combination thereof. The one or more metalloids can be or include, but are not limited to, boron, silicon, antimony, or any mixtures or compounds thereof. Utilizing the metals for the one or more layers 102, 104, 106, 108, 110, 112 of the composite panel 100 can provide electromagnetic energy (EME) protection and/or structural stiffness and/or strength.

The carbon nanomaterials or nanoparticles of the one or more layers 102, 104, 106, 108, 110, 112, 114, 116, 118, 120, 122 of the composite panel 100 can be or include, but are not limited to, one or more fullerenes, graphene, one or more carbon nanotubes (e.g., single walled and/or multiwalled nanotubes), or any combination thereof illustrative fullerenes can include, but are not limited to, C60, C70, C76, C84, and the like. Graphene can include a two-dimensional sheet of hexagonally arrayed carbon atoms having a thickness of one or more sheets of the hexagonally arrayed carbon atoms. Carbon nanotubes can include molecules having a generally elongated hollow, tubular structure.

In an exemplary implementation, no binders are disposed between adjacent layers of the plurality of layers 102, 104, 106, 108, 110, 112, 114, 116, 118, 120, 122 of the composite panel 100. For example, the adhesion or binding of the adjacent layers of the plurality of layers 102, 104, 106, 108, 110, 112, 114, 116, 118, 120, 122 of the composite panel 100 can be provided by the layers of materials or the materials themselves at the interface thereof. It should be appreciated that omitting binders can simplify the fabrication and/or reduce cost of fabricating the composite panel 100. In another implementation, one or more binders can be interposed between adjacent layers of the plurality of layers 102, 104, 106, 108, 110, 112, 114, 116, 118, 120, 122 of the composite panel 100. The one or more binders can be configured to combine, couple, and/or agglomerate each of the layers 102, 104, 106, 108, 110, 112, 114, 116, 118, 120, 122 of the composite panel 100 with one another to thereby reduce delamination. Illustrative binders can be or include, but are not limited to, one or more metallic binders, inorganic binders, organic binders, or any combination thereof. Illustrative metallic binders can include, but are not limited to, any one or more transition metals including, but not limited to, magnesium, ruthenium, osmium, iron, cobalt, nickel, copper, molybdenum, tantalum, tungsten, rhenium, or any mixtures, compounds, or alloys thereof. The metallic binders can also include, but are not limited to, any alkali metals including, but not limited to, lithium, sodium, potassium, rubidium, cesium, or any mixtures, compounds, or alloys thereof. Illustrative organic binders can be or include, but are not limited to, one or more waxes or resins that are insoluble, or at least substantially insoluble, in water. Waxes can include, for example, animal waxes, vegetable waxes, mineral waxes, synthetic waxes, or any combination thereof.

In an exemplary operation, with continued reference to FIG. 1, a method of fabricating or forming the composite panel 100 can include disposing, depositing, or otherwise forming a first layer 102. In at least one example, the first layer 102 can be deposited on a substrate, such as a mandrel or a base or support of a fabrication system (not shown in FIG. 1). In another example, illustrated in FIG. 1, the first layer 102 can also be the substrate for subsequent layers, and can form a portion of the composite panel 100. The method can also include disposing, depositing, or otherwise forming a second layer 104 adjacent the first layer 102, and binding the first layer 102 and the second layer 104 with one another, thereby reducing delamination therebetween. In one example, the binding of the first layer 102 and the second layer 104 with one another can be performed concurrently with the deposition of the second layer 104. In another example, the binding of the first layer 102 and the second layer 104 with one another can be performed after deposition of the second layer 104. For example, the binding of the first layer 102 and the second layer 104 can be facilitated by one or more processes, such as heating, curing, or the like.

It should be appreciated that the subsequent layers of the composite panel 100 can be deposited similarly to the first and second layers 102, 104. For example, a third layer 106 can be disposed adjacent the second layer 104, a fourth layer 108 can be disposed adjacent the third layer 106, a fifth layer 110 can be disposed adjacent the fourth layer 108, a sixth layer 112 can be disposed adjacent the fifth layer 110, a seventh layer 114 can be disposed adjacent the sixth layer 112, an eighth layer 116 can be disposed adjacent the seventh layer 114, a ninth layer 118 can be disposed adjacent the eighth layer 116, a tenth layer 120 can be disposed adjacent the ninth layer 118, and an eleventh layer 122 can be disposed adjacent the tenth layer 120.

While the composite panel 100 illustrated in FIG. 1 is described as being fabricated in the general direction from the first layer 102 toward the eleventh layer 122, it should be appreciated that the composite panel 100 can similarly be fabricated in the opposite direction starting from the eleventh layer 122 toward the first layer 102.

In an exemplary implementation, at least a portion of the composite panel 100 can be or include or be fabricated from alternating layers of inorganic materials and organic materials. For example, as illustrated in FIG. 1, the first, second, third, fourth, and fifth layers 102, 104, 106, 108, 110 of the composite panel 100 can be fabricated from alternating layers of inorganic materials and organic materials. Depositing alternating organic and inorganic layers can allow the fabrication of the composite panel 100 with a plurality of nano or micron sized layers. The organic and inorganic materials can be or include any organic and inorganic materials described above. In an exemplary implementation, the organic materials utilized to fabricate the alternating layers 102, 104, 106, 108, 110 of the composite panel 100 include polymers (e.g., transparent polymers), and the inorganic materials utilized to fabricate the alternating layers 102, 104, 106, 108, 110 of the composite panel 100 include one or more of aluminum oxide ($Al_2O_3$), graphene, silicon oxide, or any combination thereof. The alternating layers 102, 104, 106, 108, 110 fabricated from the polymers can be configured to reduce brittleness of the composite panel 100 or the inorganic layers thereof. In at least one example, the first, third, and fifth layers 102, 106, 110 of the composite panel 100 are fabricated from one or more polymers, and the second and fourth layers 104, 108 are fabricated from one or more of aluminum oxide ($Al_2O_3$), graphene, silicon oxide, or any combination thereof. In another example, the first, third, and fifth layers 102, 106, 110 of the composite panel 100 are fabricated from one or more of aluminum oxide ($Al_2O_3$), graphene, silicon oxide, or any combination thereof, and the second and fourth layers 104, 108 are fabricated from one or more polymers. Utilizing one or more of aluminum oxide, graphene, silicon oxide, or any combination thereof can provide impact and damage protection, and/or improved transmissivity of light. Utilizing one or more of aluminum oxide, graphene, silicon oxide, or any combination thereof can also provide improved stiffness and/or strength.

Each of the alternating layers 102, 104, 106, 108, 110 of the composite panel 100 can, separately and independently, have a thickness of from about 10 nm to about 200 nm. By providing alternating layers 102, 104, 106, 108, 110 having a thickness of from about 10 nm to about 200 nm, the number of inconsistencies can be reduced. Providing alternating layers 102, 104, 106, 108, 110 having a thickness of from about 10 nm to about 200 nm can also enable bonding between the layers 102, 104, 106, 108, 110. In at least one implementation, at least one of the alternating layers 102, 104, 106, 108, 110 can be an inner surface protection layer, and can have a thickness relatively greater than the remaining alternating layers 102, 104, 106, 108, 110. For example, the second layer 104 of the composite panel 100 illustrated in FIG. 1 can be an inner surface protection layer, and can have a thickness of from about 100 nm to about 20 µm. The inner surface protection layer is capable of or configured to provide a moisture barrier, thereby providing corrosion resistance to the composite panel 100. While only five alternating layers 102, 104, 106, 108, 110 are illustrated, it should be appreciated that the number of alternating layers illustrated is only exemplary and the number of alternating layers can be from about 200 to about 75,000 layers or more. For example, the number of alternating layers 102, 104, 106, 108, 110 utilized to form the composite panel 100 can be from about 200, about 400, about 1,000, about 10,000, about 20,000, or about 30,000 to about to about 40,000, about 50,000, about 60,000, about 75,000, or more. The number of alternating layers 102, 104, 106, 108, 110 can be at least partially determined by the desired strength and/or stiffness. Additionally, utilizing alternating layers 102, 104, 106, 108, 110 provides a pattern that is more readily repeatable for fabricating the composite panel 100.

In an exemplary implementation, at least a portion of the composite panel 100 can be or include or be fabricated from photovoltaic layers capable of or configured to utilize or collect solar energy or radiation. For example, the sixth, seventh, eighth, and ninth layers 112, 114, 116, 118 of the composite panel 100 can be photovoltaic layers. While the composite panel 100 disclosed in FIG. 1 illustrates four photovoltaic layers 112, 114, 116, 118, it should be appreciated that the number of layers illustrated is only exemplary. As such, the composite panel 100 can include any number of photovoltaic layers 112, 114, 116, 118.

The sixth layer 112 can be disposed adjacent the alternating layers 102, 104, 106, 108, 110, particularly, the fifth layer 110. The sixth layer 112 can be or include or be fabricated from an inorganic material, including aluminum oxide, graphene, or any combination thereof. The sixth layer 112 is capable of or configured to provide protection (e.g., moisture barrier) for the remaining photovoltaic layers 114, 116, 118. The sixth layer 112 can also be capable of or configured to provide a substrate for the deposition of the remaining photovoltaic layers 114, 116, 118. For example, the sixth layer 112 can have a thickness of from about 10 nm to about 20 µm.

The seventh and ninth layers 114, 118 of the photovoltaic layers of the composite panel 100 can be transparent conductive layers. The seventh and ninth layers 114, 118 of the composite panel 100 can be or include or be fabricated from one or more conductive materials, including, but not limited to, graphene, indium tin oxide, or any combination thereof. The seventh and ninth layers 114, 118 of the composite panel 100 including the one or more conductive materials can serve as electrodes for the photovoltaic layers 112, 114, 116, 118 of the composite panel 100. The seventh and ninth layers 114, 118 can, separately and independently, have a thickness sufficient to carry a charge for the photovoltaic layers 112, 114, 116, 118 of the composite panel 100. For example, the seventh and ninth layers 114, 118 can have a thickness of from about 10 nm to about 10 µm or from about 10 nm to about 5 µm.

The eighth layer 116 can be interposed between the seventh and ninth layers 114, 118, and can be a flexible photovoltaic layer fabricated from one or more of the conductive polymers (e.g., PEDOT) described above. In at least one implementation, the eighth layer 116 can include one or more conductive polymers (e.g., PEDOT) and at least one of graphene or indium tin oxide. The eighth layer 116 can have a thickness of from about 10 nm to about 10 µm. The eighth layer 116 can be capable of or configured to provide a single or a multiple junction solar cell. It should be appreciated that the seventh and ninth layers 114, 118 can be interconnected with the eighth layer 116 to carry or flow out electric current converted from light or solar energy.

The tenth layer 120 can be similar to the second layer 104 described above. For example, the tenth layer 120 can be a surface protection layer fabricated from aluminum oxide ($Al_2O_3$), graphene, or any combination thereof. The tenth layer 120 can have a thickness of from about 1 µm to about 25 µm. The tenth layer 120 can be capable of or configured to provide protection (e.g., moisture barrier, impact protection, etc.) to the composite panel 100.

The eleventh layer 122 can be similar to the seventh and ninth layers 114, 118 described above, and can be or include or be fabricated from one or more conductive materials, including, but not limited to, graphene, indium tin oxide, or any combination thereof. The eleventh layer 122 can have a thickness of from about 10 nm to about 5 μm. The eleventh layer 122 can be capable of or configured to provide protection for electromagnetic effect (EME).

While the layers 102, 104, 106, 108, 110, 112, 114, 116, 118, 120, 122 of the composite panel 100 are described above in a particular order and containing a particular composition, it should be appreciated that other orders, arrangements, and compositions described above are exemplary, and each of the layers 102, 104, 106, 108, 110, 112, 114, 116, 118, 120, 122 of the composite panel 100 can be disposed in other orders, arrangements, and can include other compositions. For example, the composite panel 100 may not include one or more of the protection layers 104, 120. In another example, the photovoltaic layers 112, 114, 116, 118 can be interposed between any two or more of the alternating layers 102, 104, 106, 108, 110.

The layers 102, 104, 106, 108, 110, 112, 114, 116, 118, 120, 122 of the composite panel 100 can be fabricated via any suitable manufacturing processes or techniques. Illustrative processes can be or include, but are not limited to, a layer deposition process, such as vacuum deposition or vacuum vapor deposition processes, such as sputtering, evaporation, sublimation, chemical vapor deposition (CVD), plasma enhanced chemical vapor deposition (PECVD), electron cyclotron resonance-plasma enhanced vapor deposition (ECR-PECVD), thermal spraying, thermal heating, sputtering, electron beam physical vapor deposition, pulsed laser deposition, or any combination thereof. Utilizing vacuum deposition processes can provide the composite panel 100 with reduced inconsistencies, as vacuum deposition processes can allow contaminants (e.g., water) that can introduce inconsistencies and/or reduce strength of the materials, to be excluded from fabrication of the composite panel 100.

The composite panel 100 of FIG. 1 can contain a combination of one or more of aluminum oxide, graphene, and silicon oxide (with or without treatment with magnesia) in an amount of from about 40% to 60% by volume, based on a total volume of the composite panel 100. It should be appreciated that utilizing silicon oxide treated with magnesia can have relatively greater strength as compared to silicon oxide without magnesia treatment. The composite panel 100 can contain aluminum oxide in an amount of from about 5% to about 25%, based on the total volume of the composite panel 100. The composite panel 100 can contain graphene in an amount of from greater than or equal to 0% to about 10%, based on the total volume of the composite panel 100. The composition of the composite panel 100 is capable of or configured to provide a desired and sufficient structural stiffness and strength, and optical transparency.

Figure 2:
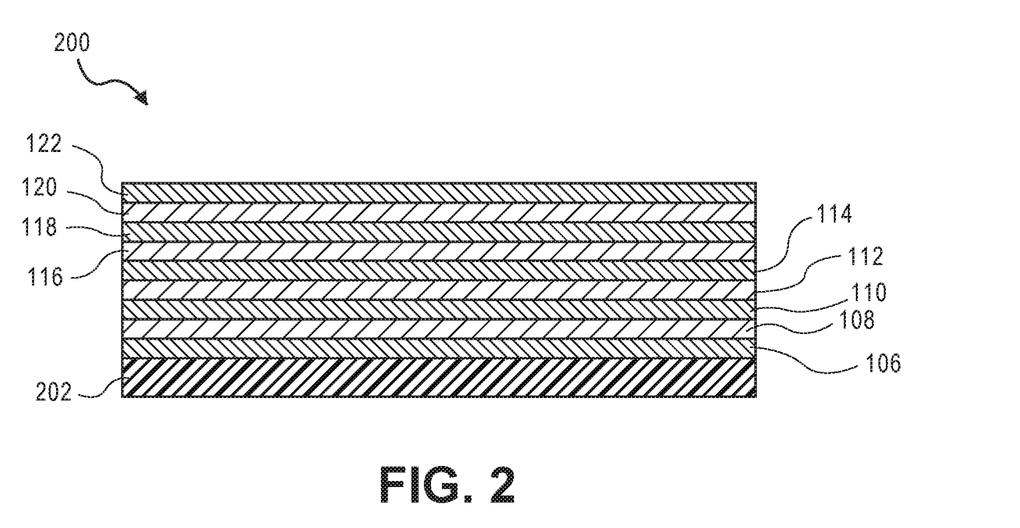
FIG. 2 illustrates a side, cross-sectional view of another exemplary composite panel including a mandrel and a plurality of layers, according to one or more implementations disclosed.

FIG. 2 illustrates a side, cross-sectional view of another exemplary composite panel 200 including a mandrel 202 and a plurality of layers 106, 108, 110, 112, 114, 116, 118, 120, 122, according to one or more implementations disclosed. The composite panel 200 illustrated in FIG. 2 can be similar in some respects to the composite panel 100 described above and therefore can be best understood with reference to the description of FIG. 1, where like numerals designate like components and will not be described again in detail. As illustrated in FIG. 2, in at least one implementation, one or more layers 102, 104 of the composite panel 100 of FIG. 1 can be replaced by a mandrel 202, and the subsequent layers 106, 108, 110, 112, 114, 116, 118, 120, 122 can be deposited on or adjacent the mandrel 202. For example, instead of forming the first and second layers 102, 104 of FIG. 1, the composite panel 200 can utilize the mandrel 202 and deposit a plurality of layers 106, 108, 110, 112, 114, 116, 118, 120, 122 on the mandrel 202 to fabricate the composite panel 200, thereby simplifying the fabrication of the composite panel 200. As discussed above, the mandrel 202 can be integral to or form a portion of the composite panel 200. Utilizing the mandrel 202 as an integral part of the composite panel 200 can provide additional structural strength and/or stiffness to the structural part 200. In another implementation, the mandrel 202 can be or form a portion of a substrate for the plurality of layers 106, 108, 110, 112, and the mandrel 202 can be separated or removed from the layers 106, 108, 110, 112, 114, 116, 118, 120, 122 to form the composite panel 200. As such, the composite panel 200 can be fabricated to have any curve or contour of the mandrel 202.

The mandrel 202 disclosed herein can be fabricated from any one or more of the materials described above with respect to the one or more layers 102, 104, 106, 108, 110, 112, 114, 116, 118, 120, 122. For example, the mandrel 202 disclosed herein can be fabricated from one or more inorganic materials, one or more organic materials, one or more ceramics, one or more alloys, one or more metals, one or more superalloys, one or more non-metals, one or more metalloids, one or more binders, one or more additives, or any combination, compounds, or composites thereof. In at least one implementation, the mandrel 202 can include or be fabricated from one or more metals, such as aluminum or steel, one or more thermoplastics, such as polyimide, polyethylene terephthalate (PET), poly(methylmethacrylate) (PMMA), or the like, or combinations thereof. Fabricating the mandrel 202 from the one or more metals, one or more thermoplastics, or combinations thereof can reduce costs. Further, the mandrel 202 can be easily fabricated from these materials. In another implementation, the mandrel 202 can be fabricated from a fibrous reinforcing materials, such as CFRP, GFRP, or the like, or combinations thereof.

Figure 3A:
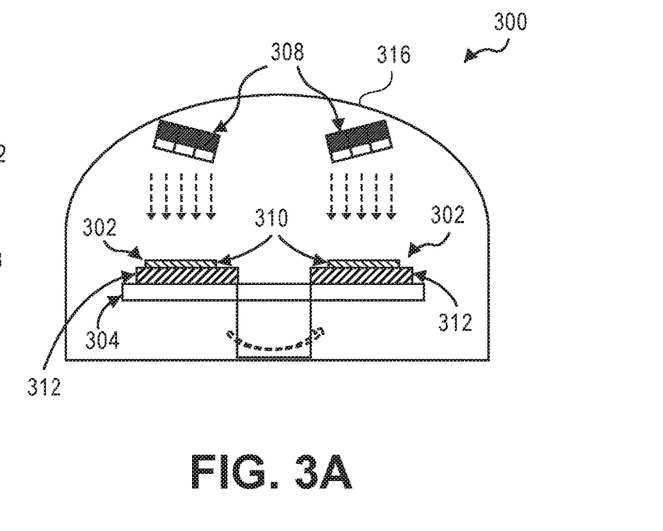
FIG. 3A illustrates a side cross-sectional view of a system for fabricating a composite panel, according to one or more implementations disclosed.
Figure 3B:
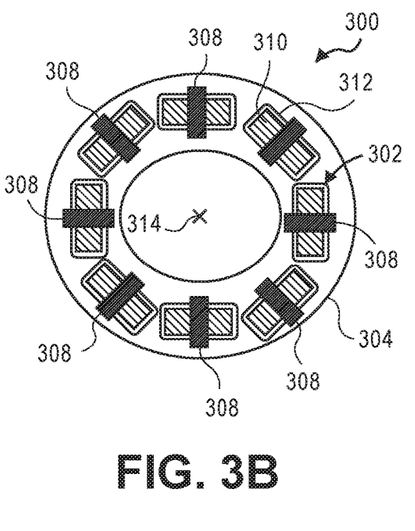
FIG. 3B illustrates an overhead or plan view of the exemplary system of FIG. 3A, according to one or more implementations disclosed.

FIG. 3A illustrates a side cross-sectional view of a system 300 for fabricating a composite panel 302, according to one or more implementations disclosed. FIG. 3B illustrates an overhead or plan view of the exemplary system 300 of FIG. 3A, according to one or more implementations disclosed. As illustrated in FIGS. 3A and 3B, the system 300 can include one or more bases 304 (one is shown 304) and one or more application nozzles or heads (eight are shown 308) disposed proximal the support 304. In at least one implementation, illustrated in FIGS. 3A and 3B, the supports 304 can be capable of or configured to hold, position, clamp, secure, or otherwise support one or more composite panels 302 (eight are shown 302) disposed thereon. The support 304 can have a diameter, width, or length of from about 1 meter to about 80 meters. In at least one implementation, illustrated in FIG. 3A, the system 300 includes an enclosure 316 capable of or configured to contain the base 304 and the application heads 306. The enclosure 316 can also be capable of or configured to maintain the base 304 and the application heads 306 under vacuum conditions to facilitate deposition or formation of the composite panels 302. The enclosure 316 is capable of maintaining a vacuum pressure of from about 1.5 Pa to about 1.3 E-6 Pa.

The application heads 308 can be disposed proximal the base 304 and configured to deposit one or more materials to form the layers 310 of the composite panels 302. For example, as illustrated in FIG. 3A, the application heads 308 can be disposed above the base 304 and configured to deposit a plurality of layers 310 to form the composite panel 302 on the base 304. In at least one implementation, the application heads 308 can be configured to deposit the layers 310 on a mandrel 312 (fixed or removable) to form the composite panel 302. In another implementation, the application heads 308 can deposit at least one layer 310 to form a substrate and further deposit subsequent layers 310 adjacent the substrate to form the composite panel 302. It should be appreciated that the first or substrate layer 310 can form or be a portion of the composite panel 302.

While eight composite panels 302 and eight application heads 308 are illustrated in FIG. 3B, it should be appreciated that the system 300 can be capable of or configured to fabricate any number of composite panels 302 using any number of application heads 308. For example, the number of composite panels 302 that can be manufactured in the system 300 can vary widely from about 1 to about 5, about 10, about 15, or more. Similarly, the number of application heads 308 utilized in the system 300 can vary widely from about 1 to about 5, about 10, about 15, or more.

In at least one implementation, the base 304 can be configured to be translated or moved relative to the application heads 308. For example, the base 304 can be configured to rotate about a center 314 thereof relative to the application heads 308, which can be stationary or fixed. In another implementation, at least one of the application heads 308 can be configured to move relative to the base 304. For example, at least one of the application heads 308 can be configured to rotate about the base 304, which can be stationary or fixed, to form the composite panels 302. In another example, the application heads 308 and/or the base 304 can be configured to move in any one or more dimensions relative to one another. It should be appreciated that rotating the application heads 308 relative to the base 304 or the base 304 relative to the application heads 308 can reduce time for fabrication, especially when fabricating multiple composite panels 302 and/or relatively large composite panels 302. For example, the application heads 308 and/or the base 304 can be translated or moved relative to one another along an X-axis, a Y-axis, a Z-axis, or any combination thereof.

Figure 4:
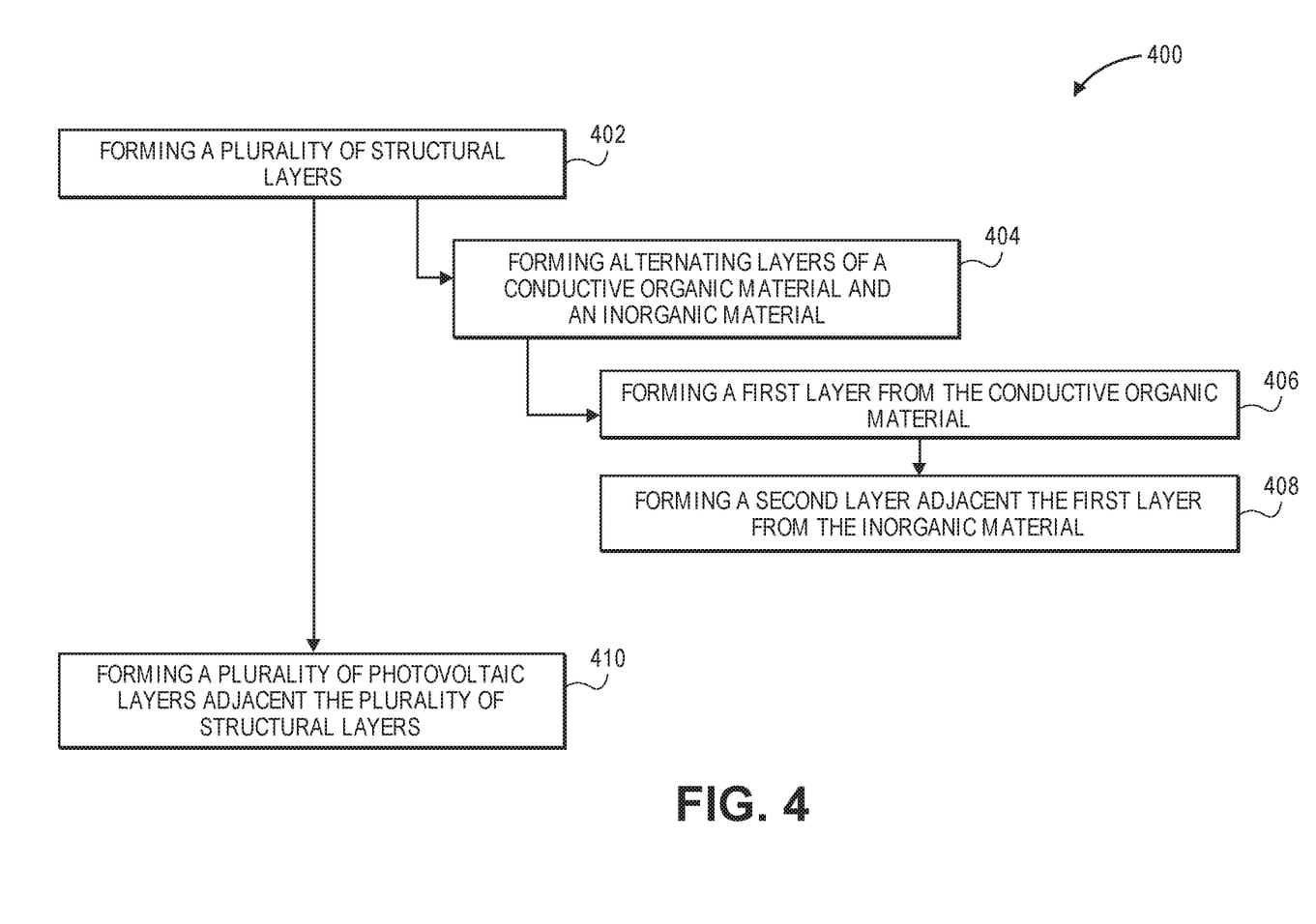
FIG. 4 illustrates a flowchart of a method for fabricating a multifunctional composite panel, according to one or more implementations disclosed.

FIG. 4 illustrates a flowchart of a method 400 for fabricating a multifunctional composite panel, according to one or more implementations disclosed. The method 400 can include forming a plurality of structural layers, as shown at 402, and forming a plurality of photovoltaic layers adjacent the plurality of structural layers, as shown at 410. Forming the plurality of structural layers 402 can include forming alternating layers of a conductive material and an inorganic material, as shown at 404. Forming alternating layers of a conductive material and an inorganic material 404 can include forming a first layer from the conductive organic material, as shown at 406, and forming a second layer adjacent the first layer from the inorganic material, as shown at 408.

The system 300 and method 400 described herein can be utilized to fabricate any suitable composite panel 100, 200 or a portion of any suitable composite panel 100, 200. In one example, the system 300 and method 400 disclosed herein can be utilized to fabricate multi-functional structural composite panels. For example, the system 300 and method 400 disclosed herein can be utilized to fabricate structural composite panels capable of utilizing or generating energy from light or solar radiation. The system 300 and method 400 can be utilized to fabricate one or more multi-functional structural composite panels 100, 200 of a transportation vehicle or vessel. For example, the system 300 and method 400 can be utilized to fabricate multi-functional structural composite panels 100, 200 of a train, a car, a bus, an automobile, an aircraft, such as an airplane or a helicopter, a boat, or the like. The system 300 and method 400 can be utilized to fabricate a floor or canopy of an airplane or a helicopter, an airplane cockpit window, a skin panel, wings, an airplane partition, a car body, an axel, a chassis, a ship hull, glass bottom of a boat, or the like. Other illustrative multi-functional structural composite panels 100, 200 that can be fabricated by the system 300 and method 400 described herein can include, but are not limited to, impellers, blades, vanes, casings, diaphragms, stators, pistons, cylinders, rods, shafts, sleeves, engine blocks, turbine discs, shroud rings, nose cones, inlet cases, exhaust cases, intermediate casings, valve blocks, nozzle blocks, inlet nozzles, discharge or outlet nozzles, inlet walls, division walls, discharge walls, or the like. In at least one implementation, the system 300 and method 400 disclosed herein can also be capable of or configured to fabricate a multifunctional (e.g., solar paneled) structural window or a window that can at least partially provide structural attributes without a frame, such as a window for an aquarium or a bay-type window. Utilizing the system 300 and method 400 described herein to fabricate the composite panel 100, 200 can provide weight efficient or green transportation airplanes, cars, ships, or the like, at high fabrication rates to thereby reduce carbon dioxide emissions.

The present disclosure has been described with reference to exemplary implementations. Although a limited number of implementations have been shown and described, it will be appreciated by those skilled in the art that changes can be made in these implementations without departing from the principles and spirit of the preceding detailed description. It is intended that the present disclosure be construed as including all such modifications and alterations insofar as they come within the scope of the appended claims or the equivalents thereof.

What is claimed is:

1. A method for fabricating a multifunctional composite panel, the method comprising:
    forming a plurality of structural layers directly on a mandrel, wherein forming the plurality of structural layers on the mandrel comprises forming a plurality of alternating layers on the mandrel, wherein each of the plurality of alternating layers comprises a first layer and a second layer, and wherein forming the plurality of alternating layers comprises:
        forming a first layer of each of the plurality of alternating layers from one or more polymers; and
        forming a second layer of each of the plurality of alternating layers directly adjacent the first layer of each of the plurality of alternating layers, wherein the second layer of each of the plurality of alternating layers is formed from one or more of aluminum oxide ($Al_2O_3$), graphene, silicon oxide, or combinations thereof;
    forming a plurality of photovoltaic layers adjacent the plurality of structural layers, wherein the multifunctional composite panel has a thickness of from about 1 mm to about 30 mm.

2. The method of claim 1, wherein the second layer of each of the plurality of alternating layers comprises a combination of aluminum oxide ($Al_2O_3$), graphene, and silicon oxide.

3. The method of claim 2, wherein the silicon oxide is treated with magnesia.

4. The method of claim 1, wherein the one or more polymers of the first layer of each of the plurality of alternating layers comprises one or more conductive polymers.

5. The method of claim 4, wherein the one or more conductive polymers comprise one or more thermoplastics, wherein the one or more thermoplastics comprise one or more of polyimide, polyethylene terephthalate (PET), poly(methylmethacrylate) (PMMA), or combinations thereof.

6. The method of claim 1, wherein the multifunctional composite panel comprises the mandrel, and wherein the mandrel is integral with the plurality of structural layers.

7. The method of claim 1, further comprising forming a surface protection layer adjacent the photovoltaic layers, wherein the surface protection layer comprises a combination of aluminum oxide and graphene.

8. The method of claim 1, wherein forming the plurality of photovoltaic layers adjacent the plurality of structural layers comprises:
   forming a third layer directly adjacent the structural layers, wherein the third layer comprises aluminum oxide, graphene, or any combination thereof;
   forming a fourth layer directly adjacent the third layer, wherein the fourth layer comprises a conductive material; and
   forming a fifth layer directly adjacent the fourth layer, wherein the fifth layer comprises one or more conductive polymers.

9. The method of claim 8, wherein forming the plurality of photovoltaic layers adjacent the plurality of structural layers further comprises forming a sixth layer directly adjacent the fifth layer, wherein the sixth layer comprises graphene, aluminum oxide, or any combination thereof.

10. The method of claim 8, wherein the conductive material of the fourth layer comprises graphene, indium tin oxide, or any combination thereof.

11. The method of claim 8, wherein the one or more conductive polymers of the fifth layer comprise one or more of poly(3,4-ethylenedioxythiophene) (PEDOT), polystyrene sulfonate (PSS), PEDOT:PSS, polypyrroles (PPy), polyaniline (PANI), polyacetylene, polythiophene (PT), polyacetylene (PAC), poly p-phenylene vinylene (PPV), or any combination thereof.

12. A multifunctional composite panel, comprising:
   a mandrel;
   a plurality of structural layers disposed directly adjacent the mandrel, wherein the plurality of structural layers comprises a plurality of alternating layers, wherein:
      each of the plurality of alternating layers comprises a first layer and a second layer, the second layer disposed directly adjacent the first layer,
      a first layer of each of the plurality of alternating layers comprises one or more polymers, and
      a second layer of each of the plurality of alternating layers comprises one or more of aluminum oxide ($Al_2O_3$), graphene, silicon oxide, or combinations thereof; and
   a plurality of photovoltaic layers disposed adjacent the plurality of structural layers, wherein the plurality of photovoltaic layers is configured to convert light energy into electrical power,
   wherein the multifunctional composite panel has a thickness of from about 1 mm to about 30 mm.

13. The multifunctional composite panel of claim 12, wherein:
   the second layer of each of the plurality of alternating layers comprises a combination of aluminum oxide ($Al_2O_3$), graphene, and silicon oxide; and
   the one or more polymers comprise one or more thermoplastics, the one or more thermoplastics comprise one or more of polyimide, polyethylene terephthalate (PET), poly(methylmethacrylate) (PMMA), or combinations thereof.

14. The multifunctional composite panel of claim 12, wherein the multifunctional composite panel comprises:
   a transparency of from about 30% to about 95%, as measured by the transmissivity of light;
   an in-plane specific stiffness of greater than or equal to $15.0E6$ $m^2/s^2$;
   a thermal expansion coefficient in one or more directions of greater than or equal to about $0°$ $K^{-1}$, and less than or equal to about $50$ $E-6°$ $K^{-1}$;
   an in-plane specific strength ($\sigma x/\rho$) of greater than or equal to about $150$ kN·m/Kg; and
   a density of from about $1.5$ $g/cm^3$ to about $2.20$ $g/cm^3$.

15. The multifunctional composite panel of claim 12, wherein the multifunctional composite panel is substantially free of structural fibers.

16. A method for fabricating a multifunctional composite panel, the method comprising:
   depositing a plurality of structural layers directly on a mandrel, wherein depositing the plurality of structural layers on the mandrel comprises depositing a plurality of alternating layers directly on the mandrel, wherein each of the plurality of alternating layers comprises a first layer and a second layer, and wherein depositing the plurality of alternating layers comprises:
      depositing a first layer of each of the plurality of alternating layers from one or more polymers, wherein the one or more polymers are selected from the group consisting of polyimide, polyethylene terephthalate (PET), poly(methylmethacrylate) (PMMA), and combinations thereof; and
      depositing a second layer of each of the plurality of alternating layers directly adjacent the first layer of each of the plurality of alternating layers, wherein the second layer of each of the plurality of alternating layers comprises one or more of aluminum oxide ($Al_2O_3$), graphene, silicon oxide, or combinations thereof;
   depositing a plurality of photovoltaic layers directly adjacent the plurality of structural layers, wherein depositing the plurality of photovoltaic layers comprises:
      depositing a first layer of the plurality of photovoltaic layers directly adjacent the plurality of structural layers, wherein the first layer of the plurality of photovoltaic layers comprises one or more of aluminum oxide, graphene, or combinations thereof;
      depositing a second layer of the plurality of photovoltaic layers directly adjacent the first layer of the plurality of photovoltaic layers, wherein the second layer of the plurality of photovoltaic layers comprises one or more conductive materials selected from the group consisting of graphene, indium tin oxide, and combinations thereof; and
      depositing a third layer of the plurality of photovoltaic layers directly adjacent the second layer of the plurality of photovoltaic layers, wherein the third layer of the plurality photovoltaic layers comprises one or more conductive polymers selected from the group consisting of poly(3,4-ethylenedioxythiophene) (PEDOT), polystyrene sulfonate (PSS), PEDOT:PSS, polypyrroles (PPy), polyaniline (PANI), polythiophene (PT), polyacetylene (PAC), poly p-phenylene vinylene (PPV), and combinations thereof;

depositing a surface protection layer directly adjacent the plurality of photovoltaic layers, wherein the surface protection layer comprises a combination of aluminum oxide and graphene, and wherein the surface protection layer has a thickness of from about 0.1 µm to about 24 µm; and depositing a transparent conductive layer directly adjacent the surface protection layer, wherein the transparent conductive layer comprises a combination of graphene and indium tin oxide.

17. The method of claim 16, wherein each of the plurality of alternating layers consists of the first and second layers.

18. The method of claim 16, wherein the mandrel is integral with the plurality of structural layers.

19. The method of claim 16, wherein the second layer of each of the plurality of alternating layers comprises aluminum oxide ($Al_2O_3$).

20. The method of claim 16, wherein the one or more conductive materials of the second layer of the plurality of photovoltaic layers is indium tin oxide.

* * * * *

UNITED STATES PATENT AND TRADEMARK OFFICE
CERTIFICATE OF CORRECTION

PATENT NO.       : 10,923,680 B2
APPLICATION NO.  : 16/157944
DATED            : February 16, 2021
INVENTOR(S)      : Jiangtian Cheng et al.

Page 1 of 1

It is certified that error appears in the above-identified patent and that said Letters Patent is hereby corrected as shown below:

In the Claims

Column 17, Line 38, delete "(PANT), polyacetylene", and insert therefor --(PANI)--.

Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office*